United States Patent [19]

Sandford, Jr. et al.

[11] 4,001,726
[45] Jan. 4, 1977

[54] HIGH ACCURACY SWEEP OSCILLATOR SYSTEM

[75] Inventors: Wayne H. Sandford, Jr., Warrington; Albert M. Bates, Southampton, both of Pa.

[73] Assignee: The United States of America as represented by the Secretary of the Navy, Washington, D.C.

[22] Filed: Jan. 23, 1976

[21] Appl. No.: 651,876

[52] U.S. Cl. .............................. 331/178; 328/186; 331/2

[51] Int. Cl.² ........................................ H03B 23/00

[58] Field of Search .................. 331/4, 2, 178, 179; 328/186; 307/227; 324/77 C, 77 CS; 325/332, 334

[56] References Cited

UNITED STATES PATENTS

| 3,144,623 | 8/1964 | Steiner | 331/178 |
|---|---|---|---|
| 3,364,437 | 1/1968 | Loposer et al. | 331/178 |

OTHER PUBLICATIONS

Hewlett Packard JN vol. 23, No. 11, July 1972, "The Incremental Sweep Generator" by Charles A. Kingsford-Smith.

Primary Examiner—John Kominski
Attorney, Agent, or Firm—R. S. Sciascia; Henry Hansen

[57] ABSTRACT

A voltage controlled sweep oscillator system which is stepped in frequency, avoiding transitional frequencies. Only discrete frequencies are provided by dividing the system into two segments wherein each segment comprises a voltage-controlled oscillator (VCO) in a phase-locked loop. A multiplexer provides one VCO signal to the output while the other VCO is stepping its frequency, and vice versa. Frequency control in each segment is achieved by comparing the divided output of a VCO with a reference frequency signal and making adjustments to cancel any errors that may appear.

13 Claims, 3 Drawing Figures

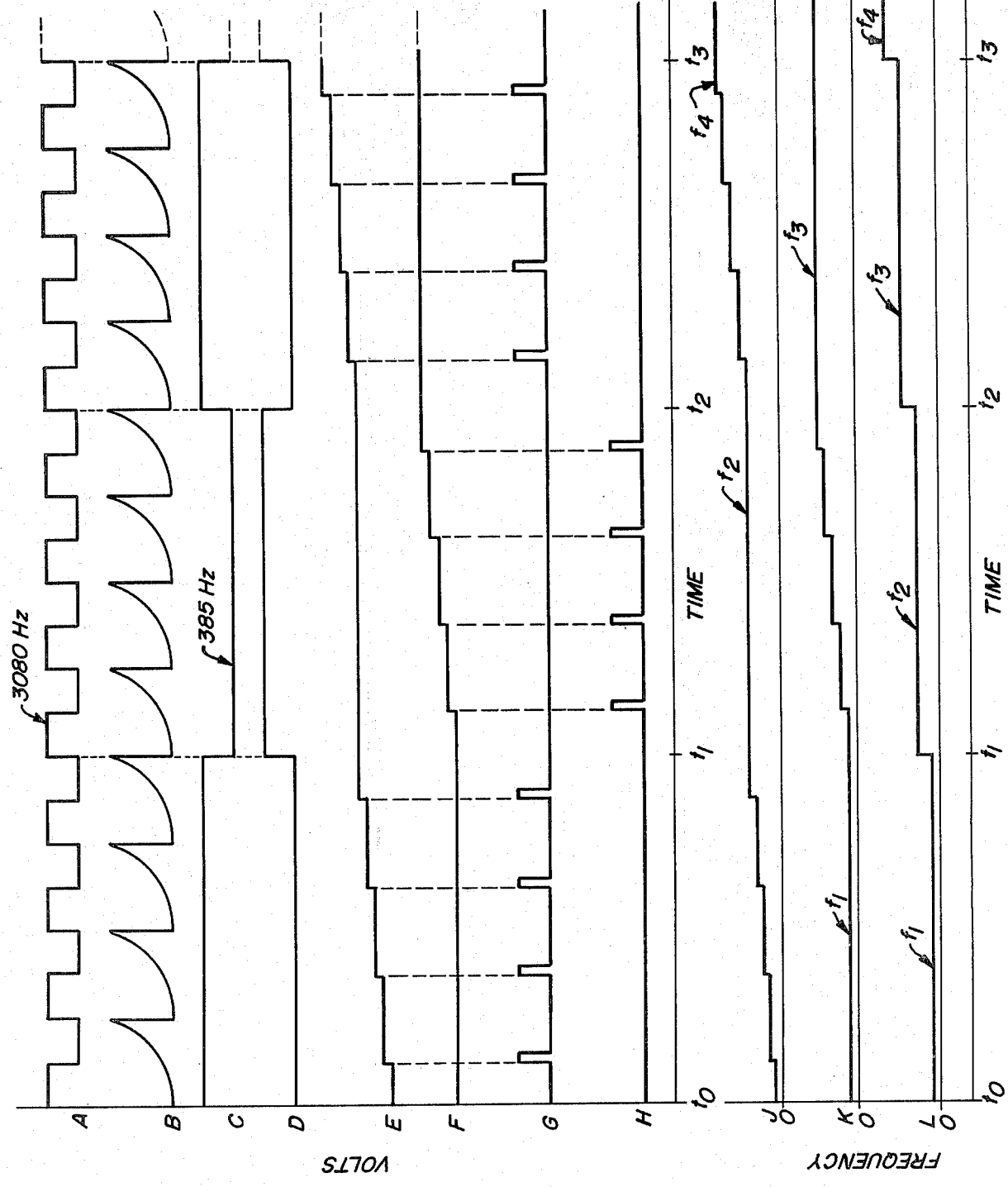

HIGH ACCURACY SWEEP OSCILLATOR SYSTEM

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to a voltage-controlled sweep oscillator system and more particularly to an oscillator system having two phase-locked loops which sweep through a plurality of stabilized discrete step frequencies.

Those concerned with the development of sweep oscillators have long recognized the need for a stepped frequency generator with exceptional frequency stability. The present invention fulfills this need.

An example of a prior art sweep oscillator utilizes a plurality of crystal oscillators of increasingly higher frequencies which are divided into odd and even groups of four oscillators each. Dual selecting circuits alternately select in numerical sequence one oscillator output from each of the groups. A delay circuit delays the step command one full period before triggering the even group binary counter. The outputs of eight sampling gates are connected in common to provide a serial output.

However, a separate crystal oscillator is necessary for each individual frequency which this device is to generate. Accordingly, for any application requiring generation of a large number of frequencies, this device could be modified accordingly only by utilization of a large number of crystal oscillators, which introduces practical difficulties and expense. Similarly, variation of the frequencies generated could only be accomplished by replacing the appropriate crystal oscillators.

Another type of prior art oscillator system, a swept oscillator system, utilizes a phase-locked VCO loop which provides a stepped frequency output. However, this oscillator cannot produce each frequency produced as an unchanging frequency, inasmuch as a sweep oscillator system must change from frequency to frequency, and the VCO loop cannot accomplish this all in one step. Thus, unwanted transitional frequencies, as well as the desired individual frequencies, would appear at the output of this oscillator.

SUMMARY OF THE INVENTION

It is therefore an object of the present invention to provide an extremely accurate sweep oscillator.

Another object of the present invention is to provide a sweep oscillator of exceptional frequency stability.

A further object of the present invention is the provision of a sweep oscillator wherein only fixed frequencies appear at the output, so that a sweeping frequency never appears at the output.

Still another object of the present invention is the provision of a sweep oscillator which can produce any number of frequencies.

Yet another object of the present invention is the provision of a sweep oscillator whose range of frequencies produced can be changed.

Briefly, these and other objects are accomplished by a unique arrangement of two multiplexed phase-locked loops, one "odd" and one "even", driven by the same reference frequency signal, and using a common ramp generator. In this arrangement, the reference frequency signal is fed into the ramp generator, producing a ramp signal with the same frequency as that of the reference. This signal is fed into each phase-locked loop, where it is amplified and provided, as a control signal, to a voltage-controlled multivibrator (also known as a voltage-controlled oscillator, or VCO). The multivibrator output then is compared with the ramp signal, and any necessary corrections are made. Each phase-locked loop includes an address counter, controlled by the reference frequency, which determines which frequency in the oscillator range is to be produced. Since there are two phase-locked loops, one VCO is allowed to step to the next frequency while the other VCO is being used to produce the frequency actually in use at that instant. The frequency in use is produced by the other VCO and is gated to the system output, while the output of the VCO being stepped does not appear at the system output. The two VCO's are therefore slaved to each other through the common reference and are alternately gated, in an odd/even scheme, to the load only when the frequency is accurate and stable.

These and other objects, advantages and novel features of the present invention will become apparent from the following detailed description when considered in conjunction with the accompanying drawings wherein:

BRIEF DESCRIPTION OF THE DRAWINGS

FIG. 2 is a waveform timing chart describing typical signals received by and generated by the system of FIG. 1; and FIG. 3 is another waveform timing chart describing typical signals generated by the system of FIG. 1.

DESCRIPTION OF THE PREFERRED EMBODIMENT

Figure 1:
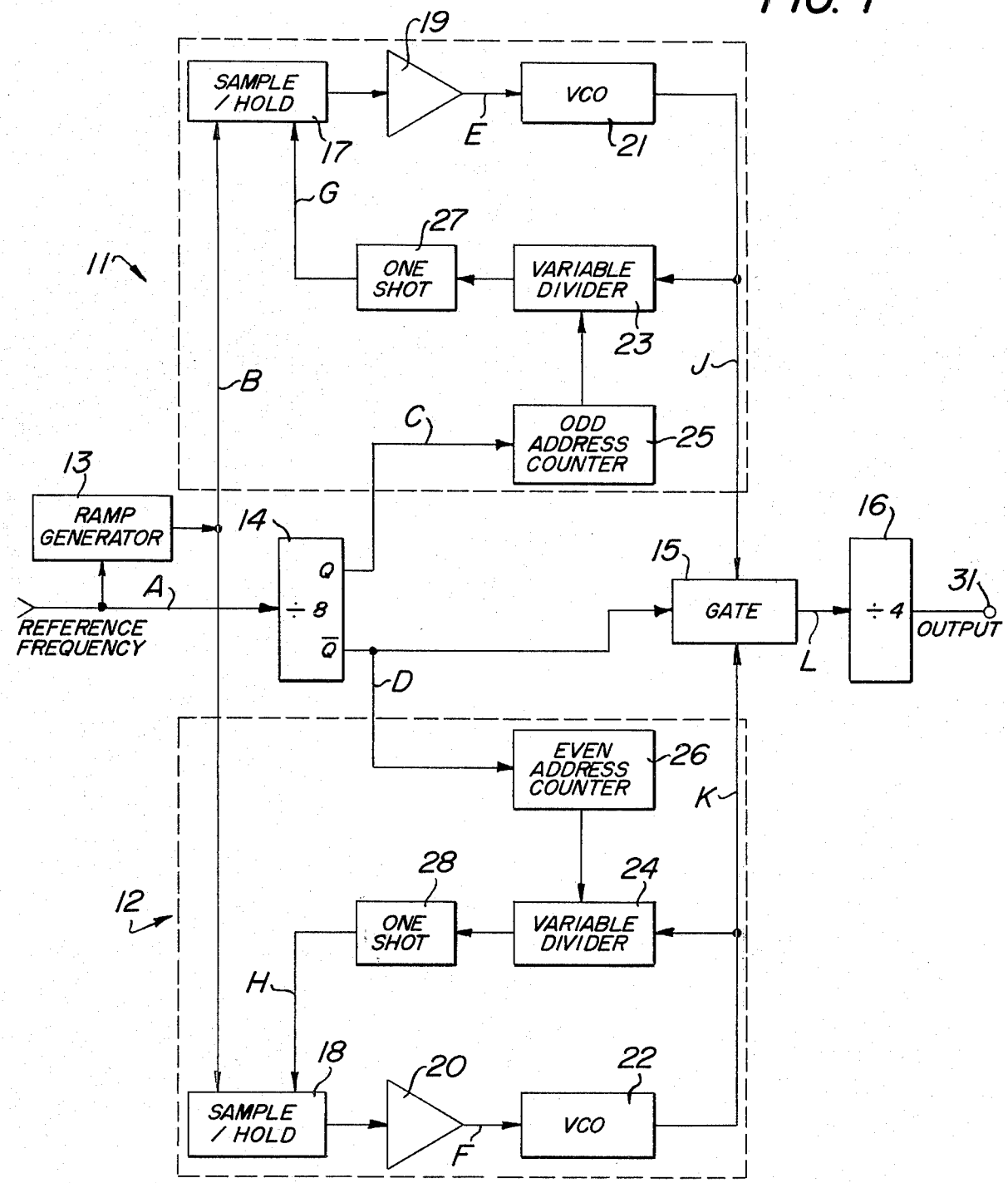
FIG. 1 is a block diagram of a sweep oscillator system according to the invention.

Referring now to the drawings there is shown in FIG. 1 a sweep oscillator comprising a ramp generator 13 coupled in parallel to a pair of multiplexed phase-locked loops, a first "odd" phase-locked loop 11 and a second "even" phase-locked loop 12. The first "odd" phase-locked loop 11 comprises a number of circuits. The output of sample/hold circuit 17 is coupled to the input of voltage level amplifier 19, whose output is coupled to the control signal input of voltage-controlled multivibrator (also known as a voltage-controlled oscillator or VCO) 21. The signal produced by VCO 21 is provided to output gate 15 and variable frequency divider (also known as a variable divider) 23. The divisor for variable divider 23 is supplied by a signal from odd address counter 25, whose output is coupled to a variable divider 23 and in turn is triggered by the signal from one output of divide-by-eight counter 14, as will be further discussed below. The output of variable divider 23 is coupled to one-shot multivibrator 27, whose output is coupled to sample/hold circuit 17.

Similarly, the second "even" phase-locked loop 12 comprises a number of circuits. The output of sample/hold circuit 18 is coupled to the input of voltage level amplifier 20 whose output is coupled to the control signal input of VCO 22. The signal produced by VCO 22 is provided to output gate 15 and variable divider 24. The divisor for variable divider 24 is supplied by a signal from even address counter 26, which is coupled to variable divider 24 and in turn is triggered by the signal from the second, inverted output of divide-by-eight counter 14, as will be further discussed below. The output of variable divider 24 is coupled to one-shot multivibrator 28, whose output is coupled to sample/hold circuit 18.

The signals from first loop 11 and second loop 12 are gated out alternately by output gate 15, and no two successive frequencies produced by the subject invention are produced by the same phase-locked loop, and each loop changes the frequency of the signal it produces within the time that the signal from the other VCO is being outputted from output gate 15, so first phase-locked loop 11 is designated the "odd" loop, and second phase-locked loop 12 is designated the "even" loop.

A reference frequency signal is provided to ramp generator 13 and divide-by-eight counter 14. Divide-by-eight counter 14 in turn produces a timing signal, having a frequency of one-eighth of that of the reference frequency signal, for multiplexing the output signals produced by phase-locked loops 11 and 12, by stepping address counters 25 and 26 and controlling gate 15. Divide-by-eight counter 14 produces this signal at two outputs, one of which produces a signal which is the inverse of the signal appearing at the other ouput. The second, inverted output of divide-by-eight counter 14 is provided to, and controls, output gate 15. Controlled by this signal, output gate 15 alternately gates out the signals produced by VCO 21 and VCO 22 to divide-by-four counter 16. The output of divide-by-four counter 16 is coupled to output terminal 31. Divide-by-four counter 16 is used to reduce the frequency of the signal produced by output gate 15 to one-fourth of its initial value. It was found that phase-locked loops 11 and 12 operate better at higher than at lower frequencies. Accordingly, phase-locked loops 11 and 12 are set to produce signals whose frequencies are four times that of the desired frequencies, and divide-by-four counter 16 reduces these frequencies to the desired values. Obviously, other dividers than a divide-by-four counter can be used, so long as the amount by which the frequencies of the signals appearing at output gate 15 are multiples of the desired frequencies is set accordingly.

In one mode of operation, a reference frequency signal of 3080 Hz, illustrated as signal A of FIG. 2, is provided to ramp generator 13. Ramp generator 13 accordingly produces a repeating ramp signal, illustrated as signal B of FIG. 2, of the same frequency as that of the reference frequency signal, here 3080 Hz. This ramp signal is provided to sample/hold circuits 17 and 18.

The reference frequency signal is also provided to the input of divide-by-eight counter 14. Counter 14 has two outputs, one, labelled "$\overline{Q}$", producing a signal illustrated as signal D of FIG. 2, being the inverse of the signal illustrated as signal C of FIG. 2, which is produced at the other output, labelled "Q". Since counter 14 is a divide-by-eight counter, the signal produced at each of these outputs will have a frequency which is one-eighth of 3080 Hz, or 385 Hz. Signal C steps odd address counter 25, whose state determines the divisor which is provided to variable divider 23. Similarly, signal D steps even address counter 26, whose state determines the divisor which is provided to variable divider 24.

The value of the divisors used in variable dividers 23 and 24, and thus of the individual counts of address counters 25 and 26, depends upon the individual frequencies which the subject invention is to produce. The value of the divisor for the desired frequency is determined by the ratio of the desired frequency to the reference frequency. However, this ratio must be multiplied by four, since utilization of divide-by-four counter 16 at the system output requires that VCO's 23 and 24 operate at frequencies which are four times the frequencies desired at the system output. This results in the formula $N = 4(f_i)/f_r$
where
  N = divisor
  $f_i$ = desired frequency
  $f_r$ = reference frequency Where $f_r$ = 3080 Hz, $N = 4(f_i)/f_r = 4(f_i)/3080$ Hz = $f_i/770$ Hz. Since N must be an integer, and assuming an initial value of $f_i$ permitting this has been chosen, then increasing $f_i$ in steps of 770 Hz will assure that N will be an integer for all values of $f_i$. Obviously, where some other value of $f_r$ is chosen, and the divider divides by some other number X, utilization of steps of $f_r/X$ will have a similar result. It is also obvious that the values of $f_r$, X and of N, and thus of address counters 25 and 26, can thus be chosen to accommodate the desired frequencies. Thus, the subject invention can be used for production of a multiplicity of series of output frequencies. Where the initial value of $f_i$, $f_o$, is for example, 422,730 Hz, the value of the divisor $$N_o = \frac{4f_i}{f_r} = \frac{(4)(422,730 \text{ Hz})}{3080 \text{ Hz}} = 549.$$

If a total of 384 frequencies are to be produced, with increments between frequencies of 770 Hz, then the final value of $f_i$, $f_n$, would be 422,730 Hz + 383(770Hz) = 717,640 Hz for which the divisor $$N_n = \frac{4f_i}{f_r} = \frac{(4)(717,640 \text{ Hz})}{3080 \text{ Hz}} = 932,$$

which requires a 10 bit counter/divider, since $2^{10}$ = 1024. Note that $4f_o = 4(422,730 \text{ Hz}) = 1,690,920$ Hz, and $4f_n = 4(717,640 \text{ Hz}) = 2,870,560$ Hz. These values are within the frequency range of the particular devices used as VCO's 25 and 26 which will allow better accuracy in the frequencies produced with respect to the control voltage signal. This use of frequencies in phase-locked loops 11 and 12 which are four times the desired frequencies necessitates the use of divide-by-four counter 16 at the system output to reduce the frequencies to the desired levels. Obviously, a divide-by-four counter need not be used in all embodiments of the present invention. Other dividers could be used in appropriate applications, depending on the frequencies desired and the characteristics of the particular oscillators used, which need not be voltage-controlled oscillators.

The variable dividers 23 and 24 used in this embodiment count up from a number provided externally (in this case, from address counters 25 and 26) to the "all ones" state, which is decoded as the end of count time. This "all ones" state which is the maximum value of each of these counters indicates a value of $2^{10}-1$ = 1023. Thus, the starting point value provided by the address counter 25 or 26 must be 1023 − N, which will permit $1023 - (1023-N) = N$ counts by the variable divider by the end of count time. Furthermore, four additonal counts at the start of a variable divider count time must be provided, to allow for time for the variable divider to be reset to the starting - point value. These four counts are actually made by the variable divider. Thus, each of the values, K, provided by address counters 25 and 26 to variable dividers 23 and 24 must be $K = 1023 - N + 4$. Since K is thus inversely proportional to N, address counters 25 and 26 must be "down" counters. In other words, starting from the initial setting, the value, K, of each of the address counters 25 and 26 decreases as the counters are stepped, the count progresses, and the frequency of the signal produced increases using the example given above, for $N_o = 549$, $K_o = 1023 - N_o - 4 = 478$. For $N_n = 932$, $K_n = 1023 - N_n + 4 = 95$. Thus, for this example, a nine-bit counter is sufficient for odd address counter 25 and for even address 26, since $2^9 = 512$, which is greater than 478, the largest intended value of K for this example. Obviously, different values of K may be required should it be desired to produce other frequencies than those given in this example. Thus, the sizes of variable dividers 23 and 24 and of address counters 25 and 26 will vary according to the requirements of various applications and embodiments of the present invention, and need not necessarily always be of the sizes given above. The number and value of the frequencies desired to be produced will chiefly determine the need sizes.

In this embodiment, variable divider 23 receives the output signal from VCO 21 and counts the number of cycles of that signal, passing through that variable divider, equal to the divisor for that variable divider as determined by odd address counter 25. The value contained in odd address counter 25 determines this divisor by setting the starting point for the variable divider 23 count. This starting-point value is decreased, and the divisor increased, as address counter 25 is stepped by the signal, illustrated as signal C of FIG. 2, from the Q output of divide-by-eight counter 14. When the count of variable divider 23 is completed, and the "all ones" state is reached, that variable divider produces a signal which is received by one-shot multivibrator 27. In response to this signal from variable divider 23, one-shot multivibrator 27 produces a pulse, illustrated as signal G of FIG. 2, which triggers sample/hold circuit 17.

Similarly, in this embodiment, variable divider 24 receives the output signal from VCO 22 and counts the number of cycles of that signal, passing through that variable divider, equal to the divisor for that variable divider as determined by even address counter 26. The value contained in even address counter 26 determimes this divisor by setting the starting point for the variable divider 24 count. This starting-point value is decreased, and the divisor increased, as address counter 26 is stepped by the signal, illustrated as signal D of FIG. 2, from the other, $\overline{Q}$ output of divide-by-eight counter 14. Since signal D is the inverse of signal C, odd address counter 25 and even address counter 26 are alternately stepped. Also, address counters 25 and 26 are stepped in increments of two, so that neither address counter will ever contain a value contained by the other address counter. When the count of variable divider 24 is completed, and the "all ones" state is reached, that variable divider produces a signal which is received by one-shot multivibrator 28. In response to this signal from variable divider 24, one-shot multivibrator 28 produces a pulse, illustrated as signal H of FIG. 2, which triggers sample/hold circuit 18.

Obviously, this is not the only manner in which variable dividers 23 and 24, and address counters 25 and 26, can conduct the variable divider counts and this invention should not be understood to be limited to the particular method described above. For example, each address counter 25 and 26 could provide the ending point, instead of the starting point, for the counts of the respective variable dividers 23 and 24. Variable dividers 23 and 24 would then count from some preset starting value S up to the ending points supplied by the respective address counters 25 and 26. When a variable divider 23 or 24 would reach this ending point, a signal, as before, would be sent to the respective one-shot multivibrator 27 or 28, which would then produce a pulse. In this situation, $K = N + S$. Thus, address counters 25 and 26 would then be "up" counters whose values would increase as these counters are stepped, and as the divisors and the frequencies produced increase.

Initially, address counters 25 and 26 must be alternately stepped by signals C and D until their values are those for the final frequencies in the sweep. Using the same example given above in discussing divisors, the final frequency, $f_n$, in the sweep of 384 frequencies, will be produced by the even phase-locked loop 12. Accordingly, at this time, even address counter 26 will contain a value of $K_n$, while odd address counter 25 will contain a value of $K_{n-1}$. Upon one more step, a standard logic network familiar to those skilled in the art, upon sensing that odd address counter 25 contains $K_{n-1}$ and is being stepped, would clear and preset the odd address counter to its appropriate starting value $K_o$, and will provide a signal to apply a predetermined voltage to sample/hold circuit 17. This voltage would then be received and amplified by amplifier 19, and applied as the control signal to VCO 21. This voltage would be of appropriate value so that VCO 21 would now be set to produce the appropriate multiple (such as four) of the output frequency desired, $f_o$, the multiple taking into account whether divide-by-four counter 16 or some other divider is being used at the system output. Similarly, upon one further step, another standard logic network familiar to those skilled in the art would, upon sensing that even address counter 26 contains $K_n$ and is being stepped, clear and preset the even address counter to its appropriate starting value $K_1$, and will provide a signal to apply a predetermined voltage to sample/hold circuit 18. This voltage would then be received and amplified by amplifier 20, and applied as the control signal to VCO 22. This voltage would be of an appropriate value so that VCO 22 would now be set to produce the appropriate multiple (such as four) of the output frequency desired, $f_1$, the multiple taking into account whether divide-by-four counter 16 or some other divider is being used at the system output. For additional accuracy, phase-locked loops 11 and 12 can be used to check the accuracy of $f_o$ and $f_1$, respectively, if desired.

In order to ensure that this process is completed in proper sequence, an additional step interval should be allowed between the production of $f_n$ and the production of $f_o$. During this interval, the sweep oscillator system should not be considered to be producing a usable signal. Since only one step interval, instead of two, is used for this purpose, signal C would be 180° out of phase with the proper sequence for stepping odd address counter 25, and signal D would similarly be 180° out of phase with the proper sequence for stepping even address counter 26. To prevent this problem, at the end of this interval, before $f_o$ is to be produced at output terminal 31, divide-by-eight counter 14 must be cleared, in order to place that divider in the appropriate state for the sweep oscillator system beginning a sweep from $f_o$ to $f_n$.

This process of resetting the sweep oscillator system must also be performed at the end of a sweep in order to begin another sweep of frequencies, with the obvious exception that stepping odd address counter 25 to $K_{n-1}$ and even address counter 26 to $K_n$ is accomplished during the sweep itself, and need not be specially undertaken. Obviously, there are other methods by which this process could be accomplished. For example, address counters 25 and 26 might be returned to values of $K_o$ and $K_1$, respectively, after being allowed to reach $K_n + 1$ and $K_{n+2}$, respectively, and these respective values are detected by the logic network discussed above. As another alternative, only even address counter 26 might be interrogated. The value contained in odd address counter 25 would be changed, for this example, from $K_{n-1}$ to $K_o$, while even address counter 26 would be at $K_n$. The value contained in even address counter would be changed to $K_1$ when it reaches $K_{n+2}$.

Phase-locked loop 11 operates in the following manner. Even at the start of a sweep, a control signal will be applied to VCO 21, which thus will be producing a signal, and odd address counter 25 will contain the proper value, as has already been discussed above. The frequency of the signal produced by VCO 21 is determined by the amplitude of the control signal applied to that VCO. This signal is received by output gate 15, as shall be discussed below, and by variable divider 23. Variable divider 23 counts the number, determined by the value contained in odd address counter 25, of cycles of the signal from VCO 21, and, upon completing this count, sends a signal to one-shot multivibrator 27. Upon receiving this signal from variable divider 23, one-shot multivibrator 27 produces a pulse signal which triggers sample/hold circuit 17. Sample/hold circuit 17, upon receiving a pulse from one-shot multivibrator 27, samples, at that instant, the voltage amplitude of signal B, and provides that voltage to amplifier 19. Amplifier 19 amplifies and offsets this voltage to a level within the range of VCO 21, and provides the amplified signal to that VCO as the control voltage signal. VCO 21 produces a signal of the frequency called for by the control voltage signal it is receiving. This signal is received by variable divider 23, after whose count another trigger signal is received by sample/hold circuit 17 from one-shot multivibrator 27, and the cycle continues.

Phase-locked loop 12 operates in a similar manner. The frequency of the signal produced by VCO 22 is determined by the amplitude of the control signal applied to that VCO. This signal is received by output gate 15, as shall be discussed below, and by variable divider 24. Variable divider 24 counts the number, determined by the value contained in even address counter 26, of cycles of the signal from VCO 22, and, upon completing this count, sends a signal to one-shot multivibrator 28. Upon receiving this signal from variable divider 24, one-shot multivibrator 27 produces a pulse signal which triggers sample/hold circuit 18. Sample/hold circuit 18, upon receiving a pulse from one-shot multivibrator 28, samples, at that instant, the voltage amplitude of signal B, and provides that voltage to amplifier 20. Amplifier 20 amplifies and offsets this voltage to a level within the range of VCO 22, and provides the amplified signal to that VCO as the control voltage signal. VCO 22 produces a signal of the frequency called for by the control voltage signal it is receiving. This signal is received by variable divider 24, after whose count another trigger signal is received by sample/hold circuit 18 from one-shot multivibrator 28, and the cycle continues.

The time time for each of variable dividers 23 and 24 to complete a count is dependent upon two variables. As the frequency of the signal from the corresponding VCO 21 or 22 increases, the period of each cycle will decrease, thus making the count quicker. This frequency would increase as a result of an increase in the control signal applied to corresponding VCO 21 or 22. Also, an increase in the divisor, resulting from stepping of corresponding address counter 25 or 26, will increase the number of cycles required to complete a variable divider 23 or 24 count, and thus increase the time required to complete the count. The reference frequency, desired output frequencies, and divisors must be so selected that one sample/hold circuit 17 or 18 is triggered once per ramp signal cycle. If this is the case, any increase or decrease in count time for variable divider 23 will result in a sampling of the ramp at a time later or sooner in the cycle than the previous sampling, resulting in a correspondingly higher or lower sampled voltage amplitude and a corresponding increase or decrease in the frequency of the signal produced by VCO 21 or 22. Any change in the frequency of this signal results in a corresponding change in count time for variable divider 23 and 24, and so on. It will usually be the case that the control voltage, and thus the frequency of the signal produced by VCO's 21 and 22, will be increasing or stable, until the end of the sweep is reached. This increasing frequency signal is illustrated, for odd phase-locked loop 11, by signal J of FIG. 3; the corresponding control voltage signal is illustrated as signal E of FIG. 2. The increasing frequency signal produced by even phase-locked loop 12 is illustrated by signal K of FIG. 3; the corresponding control voltage signal is illustrated as signal F of FIG. 2. Frequencies of $f_1$, $f_2$, $f_3$ and $f_4$ as shown in FIG. 3 are used solely for comparative example, showing four successive frequencies produced by the subject invention, and do not necessarily refer to frequencies $f_1$, $f_2$, $f_3$ and $f_4$ covered by the sweep in the example given above. As address counters 25 and 26 are stepped, the divisor increases, and the ramp of signal B is sampled successively later in time. The corresponding increase in control voltage results in increased corresponding VCO 21 or 22 output frequency. However, until this output frequency is increased to a level which will compensate for the increase in the divisor, the control voltage will continue to increase. Frequency stability in phase-locked loop 11 is achieved when the VCO 21 control voltage ceases to change. Frequency stability in phase-locked loop 12 is achieved when the VCO 22 control voltage ceases to change. In either situation, when frequency stability is achieved, the ramp of signal B is sampled at exactly the same point each time that sample/hold circuit 17 or 18 is triggered. This means that the sampling is being performed at the ramp repetition rate for signal B, which is equal to the frequency of reference frequency signal A. Therefore, the output signal must be an integer multiple of the reference frequency. This integer is a divisor N. Frequency stability should be achieved within four reference frequency cycles, although this is not absolutely necessary and provision can be made for allowing more or less time for this purpose. Note that address counters 25 and 26 are alternately stepped, while one phase-locked loop 11 or 12 is producing a signal which appears at output terminal 31, the other phase-locked loop is increasing the frequency of the signal it is producing to the next level. Phase-locked loops 11 and 12 operate continuously, but their output signals are gated out alternately by output gate 15. Output gate 15 is controlled by signal D from divide-by-eight counter 14. When signal D is high, the output signal J from phase-locked loop 11 is gated out. When signal D is low, the output signal K from phase-locked loop 12 is gated out. This results in the production of composite signal K at the output of output gate 15. Obviously, control of output gate 15 must be synchronized with the stepping of address counters 25 and 26, so that a frequency which is changing will not appear at output terminal 31. Therefore, signal D is used to control output gate 15. If each frequency produced has the same duration at output terminal 31, then, where four reference frequency cycles are used to set each new output frequency, an address counter 25 or 26 must be stepped, and a new output frequency gated out, once every four reference frequency cycles. Since both address counters 25 and 26 are stepped, and two new output frequencies gated out, per cycle of signal D, then each cycle of signal D (and of signal C) must have a period of eight reference frequency cycles, or in other words a frequency of ⅛ $f_r$. For $f_r$ = 3080 Hz, ⅛ $f_r$ = 385 Hz, the signal produced by divide-by-eight counter 14. Since two new output frequencies are produced per cycle of this signal, each output frequency has a duration of (½)/385 seconds, or about 1.3 milliseconds. If a shorter or longer frequency duration is desired, or more or less time is desired to allow each phase-locked loop 11 and 12 to advance to a new frequency and stabilize, a divider other than a divide-by-eight counter could be used in place of divide-by-eight counter 14, or a different reference frequency could be used (within the constraints on reference frequency with regard to the desired output frequencies, as has already been discussed).

It should be understood that a different repetitive waveform, other than a ramp, can be used for the signal sampled by sample/hold circuits 17 and 18. Furthermore, the subject invention could be operated without imposing any waveform on the reference frequency signal, if phase comparators, instead of sample/hold circuits 17 and 18, are used to directly compare the signals produced by VCO's 21 and 22 with the reference frequency, and to produce an error signal if necessary. Also, the oscillators used in this sweep oscillator system need not be a voltage-controlled oscillators; other types of controlled oscillators, such as current-controlled oscillators, could be used instead. In addition, amplifiers 19 and 20 might not be absolutely necessary. Also, it should be understood that this sweep oscillator sytem can, with an appropriate sequence of divisors, produce a sweep of frequencies which decrease, instead of increasing. Finally, it should be understood that the subject invention is not limited to a reference frequency signal of 3080 Hz frequency.

Thus there has been provided a novel sweep oscillator system which is extremely accurate, and which has exceptional frequency stability. The continuous frequency checking and adjustment involved in producing the ouput frequencies results in a highly accurate, as well as stable, frequency output. Furthermore, only fixed, and not sweeping frequencies appear at the output. Each output frequency is produced as a discrete step, and has a definite duration which can be altered according to the needs of the user. The subject invention is also capable of producing any number of frequencies, which number can be set and altered by the user as desired. The range of frequencies produced can also be readily adjusted as desired. There is no need for replacing or adding oscillators for these last two purposes. The subject invention can be constructed using any number of existing technologies, including complementary metal-oxide-semiconductor (CMOS) integrated circuit technology. Use of CMOS circuitry results in lower power dissipation and greater reliability than would be possible if other technologies were used.

Obviously many modifications and variations of the present invention are possible in light of the above teachings. It is therefore to be understood that within the scope of the appended claims the invention may be practiced otherwise than as specifically described.

What is claimed is:

1. A sweep oscillator system for producing a series of signals of incrementally higher frequencies and equal duration from a reference frequency signal comprising:
   selector means receiving the reference frequency signal for producing
   a timing signal indicative of a preselected duration;
   first and second phase-locked loops connected to receive the reference
   frequency signal and said timing signal for alternatively producing
   respective output signals of the incrementally higher frequencies; and gating means receiving said output signals and said timing signal, for
   combining said output signals and producing at the output thereof the series of signals.

2. A sweep oscillator system as defined in claim 1 further comprising: waveform generating means receiving said reference frequency signal
   and producing a repetitive signal having a predetermined waveform and a frequency equal to that of said reference frequency signal coupled to said first and second phase-locked loops.

3. A sweep oscillator system as defined in claim 2 wherein said waveform generating means comprises ramp generating means.

4. A sweep oscillator system as defined in claim 1 wherein each of said phase-locked loops comprises:
   sample/hold means for receiving said reference frequency signal and a trigger signal and for producing a control signal which is representative of some feature of said reference frequency signal upon receipt of said trigger signal;
   oscillator means receiving said control signal for producing one of said respective output signals whose frequency is controlled by said control signal; and
   timing means receiving said one output signal and said timing signal for producing said trigger signal.

5. A sweep oscillator system as defined in claim 4 wherein each of said timing means comprises:
   first counting means receiving one of said respective output signals for producing a signal when a predetermined number of cycles of said one output signal has been counted;

second counting means receiving said timing signal and coupled to said first counting means for producing a signal for setting said predetermined number of pulses; and triggering means receiving said first counting means signal for producing, upon receiving said first counting means signal, a trigger signal for triggering said sample/hold means.

6. A sweep oscillator system as defined in claim 5 wherein said triggering means comprises a one-shot multivibrator.

7. A sweep oscillator system as defined in claim 5 wherein said first counting means comprises a variable frequency divider.

8. A sweep oscillator system as defined in claim 7 wherein said second counting means comprises an address counter for setting the divisor for said variable divider.

9. A sweep oscillator system as defined in claim 5, wherein said selector means comprises first divider means receiving said reference frequency signal for reducing the frequency of said reference frequency signal by a first predetermined divisor, whereby the timing signal produced by said first divider means is provided to alternately step each said second counting means.

10. A sweep oscillator system as defined in claim 4 wherein said oscillator means comprises a voltage-controlled oscillator.

11. A sweep oscillator system as defined in claim 10 wherein each of said phase-locked loops further comprises:

a voltage level amplifier coupled between said sample/hold means and said voltage-controlled oscillator for amplifying said control signal.

12. A sweep oscillator system as defined in claim 4 wherein said gating means comprises a network of logic gates whereby the output of each oscillator means is gated out alternately, as controlled by said timing signal which is provided to said network.

13. A sweep oscillator system as defined in claim 12 wherein said gating means further comprises second divider means, coupled to the output of said network, for reducing the frequency of the signal provided at said network output by a second predetermined divisor.

* * * * *